United States Patent
Jones et al.

(10) Patent No.: US 11,996,677 B2
(45) Date of Patent: May 28, 2024

(54) LASER PULSER CIRCUIT WITH TUNABLE TRANSMIT POWER

(71) Applicant: Waymo LLC, Mountain View, CA (US)

(72) Inventors: Joshua Jones, Mountain View, CA (US); Augusto Tazzoli, San Jose, CA (US); Pierre-yves Droz, Los Altos, CA (US)

(73) Assignee: Waymo LLC, Mountain View, CA (US)

( * ) Notice: Subject to any disclaimer, the term of this patent is extended or adjusted under 35 U.S.C. 154(b) by 732 days.

(21) Appl. No.: 17/137,331

(22) Filed: Dec. 29, 2020

(65) Prior Publication Data
US 2021/0199762 A1    Jul. 1, 2021

Related U.S. Application Data

(60) Provisional application No. 62/954,810, filed on Dec. 30, 2019.

(51) Int. Cl.
*H01S 5/042*    (2006.01)
*G01S 7/484*    (2006.01)
(Continued)

(52) U.S. Cl.
CPC .......... *H01S 5/06804* (2013.01); *G01S 7/484* (2013.01); *G01S 17/10* (2013.01);
(Continued)

(58) Field of Classification Search
CPC ....... H01S 5/042; H01S 5/0428; H05B 45/32; H05B 45/3725; G01S 7/483; G01S 7/484; G01S 7/486; G01S 17/10
See application file for complete search history.

(56) References Cited

U.S. PATENT DOCUMENTS 2,782,867 A    2/1957    Hall
3,339,108 A    8/1967    Holtje
(Continued)

FOREIGN PATENT DOCUMENTS

| | | |
|---|---|---|
| CN | 109496008 A | 3/2019 |
| DE | 291433 A5 | 10/1983 |
| EP | 3159982 A1 | 11/2019 |

OTHER PUBLICATIONS

Glaser, "How GaN Power Transistors Drive High-Performance Lidar," IEEE Power Electronics Magazine, Mar. 7, 2017.
(Continued)

*Primary Examiner* — Xinning(Tom) Niu
*Assistant Examiner* — Delma R Fordé
(74) *Attorney, Agent, or Firm* — McDonnell Boehnen Hulbert & Berghoff LLP

(57) ABSTRACT

A method includes applying, by a switching circuit, pulses of an input voltage to an input of an inductor. The method includes charging, in accordance with an off state of a switch, a charge storage device through the inductor using the pulses of the input voltage such that the circuit node develops a charge voltage that is greater than the input voltage. The method includes discharging, in accordance with an on state of the switch, the charge storage device such that a first portion of the charge voltage is applied to a light emitter and a second portion of the charge voltage is applied to parasitic inductance. The method includes controlling, by a controller, a timing of the pulses of the input voltage applied by the switching circuit based on a parasitic inductance from a previous charging cycle of the charge storage device, so as to control the charge voltage.

20 Claims, 8 Drawing Sheets

(51) Int. Cl.
*G01S 17/10* (2020.01)
*G01S 17/14* (2020.01)
*H01S 5/068* (2006.01)
*H03K 3/017* (2006.01)
*H03K 3/53* (2006.01)

(52) U.S. Cl.
CPC .............. *G01S 17/14* (2020.01); *H01S 5/042* (2013.01); *H01S 5/0428* (2013.01); *H03K 3/017* (2013.01); *H03K 3/53* (2013.01)

(56) References Cited

U.S. PATENT DOCUMENTS

| | | | |
|---|---|---|---|
| 4,787,087 | A | 11/1988 | Hashimoto et al. |
| 6,808,607 | B2 | 10/2004 | Christie |
| 7,977,926 | B2 | 7/2011 | Williams |
| 9,337,812 | B2 | 5/2016 | Bandell |
| 9,368,936 | B1 | 6/2016 | Lenius et al. |
| 9,784,835 | B1 | 10/2017 | Droz et al. |
| 9,819,146 | B2 | 11/2017 | Liffran et al. |
| 10,048,358 | B2 | 8/2018 | Berger et al. |
| 10,158,211 | B2 | 12/2018 | Barnes et al. |
| 10,797,698 | B1 * | 10/2020 | Droz ................ H03K 17/04123 |
| 10,903,621 | B2 * | 1/2021 | Stern ..................... H01S 5/0428 |
| 2018/0109074 | A1 | 4/2018 | Gassend et al. |
| 2018/0267152 | A1 | 9/2018 | McMichael et al. |
| 2018/0323576 | A1 | 11/2018 | Crawford et al. |
| 2019/0229493 | A1 | 7/2019 | Stern |

OTHER PUBLICATIONS

International Search Report and Written Opinion for PCT/US2020/067390, dated Apr. 26, 2021.

* cited by examiner

LASER PULSER CIRCUIT WITH TUNABLE TRANSMIT POWER

CROSS-REFERENCE TO RELATED APPLICATIONS

This application claims priority to U.S. Provisional Patent Application No. 62/954,810, filed Dec. 30, 2019, which is incorporated herein by reference in its entirety and for all purposes.

BACKGROUND

Unless otherwise indicated herein, the materials described in this section are not prior art to the claims in this application and are not admitted to be prior art by inclusion in this section.

Light detection and ranging (LIDAR) devices may estimate distances to objects in a given environment. For example, an emitter subsystem of a LIDAR device may emit light pulses, which may interact with objects in the device's environment. At least a portion of the light pulses may be redirected back toward the LIDAR (e.g., due to reflection or scattering) and detected by a detector subsystem. Aspects of LIDAR circuitry used for achieving this functionality can introduce complications in LIDAR devices. For example, driving light pulses from a light emitter subsystem may result in parasitic inductance. Accounting for this parasitic inductance can lead to design complications in the LIDAR device.

SUMMARY

In one example, a method is provided. The method includes applying, by a switching circuit, pulses of an input voltage to an input of an inductor. The method includes charging, in accordance with an off state of a switch, a charge storage device through the inductor using the pulses of the input voltage such that the circuit node develops a charge voltage that is greater than the input voltage. The method includes discharging, in accordance with an on state of the switch, the charge storage device such that a first portion of the charge voltage is applied to a light emitter and a second portion of the charge voltage is applied to parasitic inductance. The method includes controlling, by a controller, a timing of the pulses of the input voltage applied by the switching circuit based on a parasitic inductance from a previous charging cycle of the charge storage device, so as to control the charge voltage.

In an another example, a system is provided. The system includes an inductor having an input and an output, a circuit node, a diode connected between the output of the inductor and the circuit node, a charge storage device connected to the circuit node, a switch, a light emitter connected between the circuit node and the switch, and a switching circuit configured to apply pulses of an input voltage to the input of the inductor. When the switch is in an off state, the pulses of the input voltage charge the charge storage device through the inductor and diode such that the circuit node develops a charge voltage that is greater than the input voltage. When the switch is in an on state, the charge storage device discharges such that a first portion of the charge voltage is applied to the light emitter and a second portion of the charge voltage is applied to parasitic inductance. The system further includes a controller configured to control a timing of the pulses of the input voltage applied by the switching circuit based on a parasitic inductance from a previous charging cycle of the charge storage device, so as to control the charge voltage.

In another example, a light detection and ranging (LIDAR) device is provided. The LIDAR device includes an inductor having an input and an output, a circuit node, a diode connected between the output of the inductor and the circuit node, a charge storage device connected to the circuit node, a switch, a light emitter connected between the circuit node and the switch, and a switching circuit configured to apply pulses of an input voltage to the input of the inductor. When the switch is in an off state, the pulses of the input voltage charge the charge storage device through the inductor and diode such that the circuit node develops a charge voltage that is greater than the input voltage. When the switch is in an on state, the charge storage device discharges such that a first portion of the charge voltage is applied to the light emitter and a second portion of the charge voltage is applied to parasitic inductance. The LIDAR device further includes a controller configured to control a timing of the pulses of the input voltage applied by the switching circuit based on a parasitic inductance from a previous charging cycle of the charge storage device, so as to control the charge voltage.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

DETAILED DESCRIPTION

Figure 1:
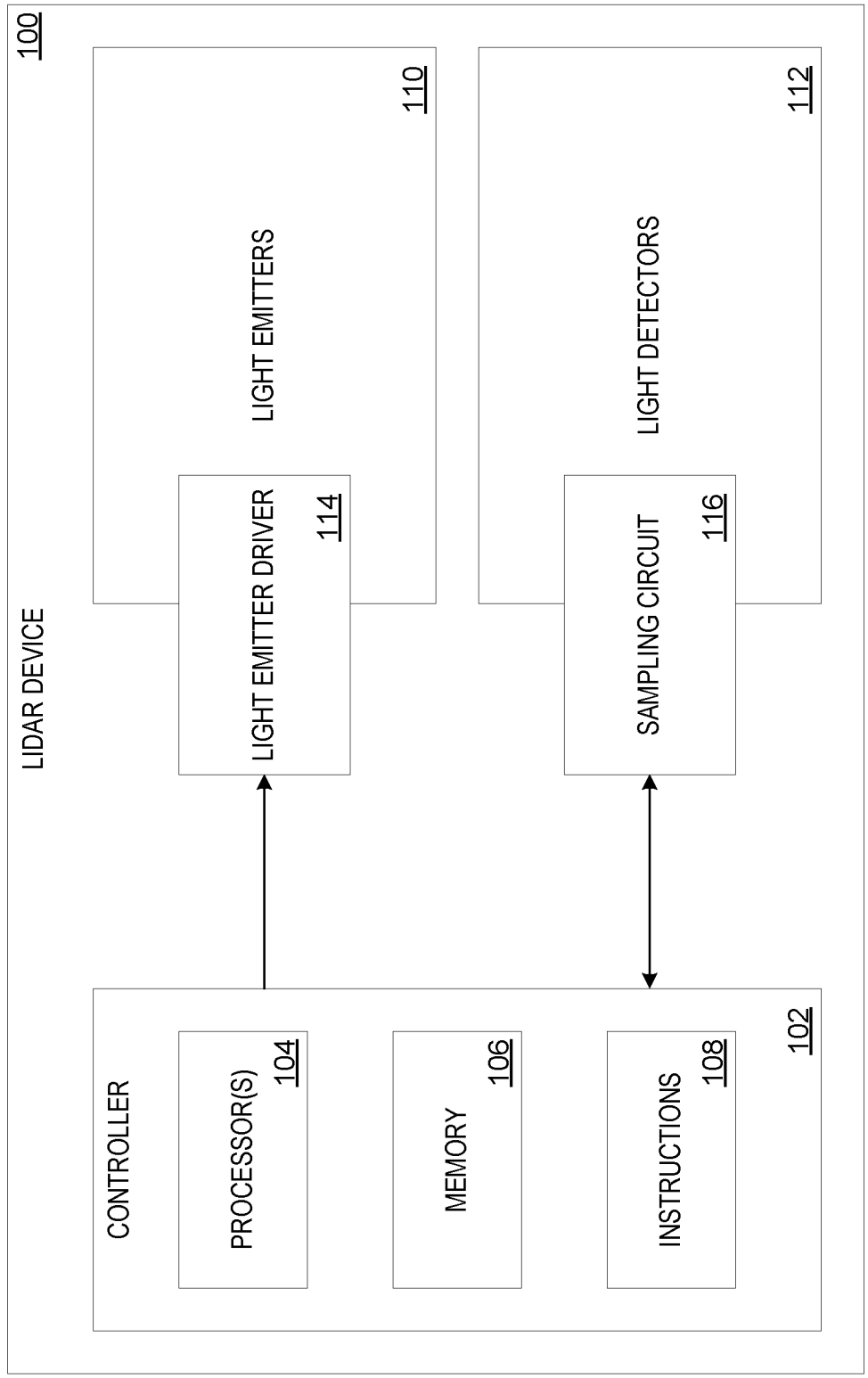
FIG. 1 is a simplified block diagram of a LIDAR device, according to an example embodiment.

Exemplary implementations are described herein. It should be understood that the word "exemplary" is used herein to mean "serving as an example, instance, or illustration." Any implementation or feature described herein as "exemplary" or "illustrative" is not necessarily to be construed as preferred or advantageous over other implementations or features. In the figures, similar symbols typically identify similar components, unless context dictates otherwise. The example implementations described herein are not meant to be limiting. It will be readily understood that the aspects of the present disclosure, as generally described herein and illustrated in the figures, can be arranged, substituted, combined, separated, and designed in a wide variety of different configurations.

I. OVERVIEW

Within examples, a LIDAR system can include one or more light emitters connected to a pulser circuit. The pulser circuit could be configured to charge a charge storage device (e.g., a capacitor) based on an input voltage. The pulser circuit may receive a trigger signal and responsively provide an electrical pulse to a light-emitter device (e.g., a laser diode). In response to the electrical pulse, the light-emitter device may emit a light pulse.

The pulser circuit may include a charge storage device and a voltage doubler circuit configured to provide a voltage of muliplier of about 2*Vn (or more generally k*Vn depending on inductance, capacitance, and timing in the system) across the charge storage device. In some embodiments, the pulser circuit may include a parasitic inductance (L) that may lower the voltage across the light emitter (e.g., a laser diode) based on the time rate of change of the current through the inductor during a discharge phase (e.g., 2*Vn−(L*dI/dT)). Parasitic inductance in this context may be represented by a charged inductor (see, e.g., FIG. 3C). In some systems, this voltage reduction from parasitic inductance may result in higher voltage requirements for subsequent pulses. Though some examples provided herein describe a voltage doubler, it should be understood that a range of voltages can be generated from 0 V to k*Vn. Accordingly, in some examples the voltage across the light emitter may be less than Vn.

Within examples, a LIDAR device can leverage the voltage drop associated with parasitic inductance to accurately control a desired output from the light emitter. Further, the parasitic inductance can be used to increase an overall energy level available for pulsing the light emitter. This may involve altering a time difference between a rising edge of a trigger signal for discharging the charge storage device and a rising edge of an input pulse for recharging the charge storage device. Accordingly, by selecting the appropriate charge storage device charging time, a greater portion of the electrical pulse can go to optical power output from the light-emitter device instead of heating losses. In some embodiments, by operating the pulser circuit at appropriate timing intervals, the pulser circuit may increase current efficiency and/or provide more light output relative to a nominal energy input. Accordingly, in this manner, a transmit power of the laser power circuit is tunable based on input voltage pulse width, trigger signal timing and/or pulse timing, or a combination thereof.

A system associated with a pulser circuit, such as a sensor system on a vehicle, may encounter contexts in which it is desirable to dynamically change the power level of emitted light pulses. For example, retroreflective materials may reflect pulses at relatively high intensities that can oversaturate light detectors (e.g., a SiPM or an APD), resulting in inaccurate depth measurements of an environment. Detection of a retroreflective object using a first light pulse may provide a trigger for adjusting a power level of a subsequent light pulse. As another example, a vehicle may have different ranges for obtaining depth information. For example, an area in front of the vehicle may be associated with a first range, while an area below and/or next to the vehicle (e.g., a road surface) may be associated with a second range. Determining an angle and direction of emission for each light pulse may trigger dynamic adjustment of a power level for each sequential light pulse. As yet another example, external or internal conditions of the system or the pulser circuit itself may serve as a trigger for dynamic adjustment of power levels for light pulses. For example, certain conditions can result in mismatching power between light emitters. This mismatch could be static due to variation in the LC time constant of each pulser circuit, propagation delay in each pulser circuit driver, tolerance in a charge storage capacitor of each pulser circuit, or semiconductor process variation. A static mismatch can serve as a trigger to adjust power outputs from one or more pulser circuits. The mismatch could also be dynamic in the case of the voltage/temperature coefficient in a charge storage capacitor of a given pulser circuit. In these examples, adjusting aspects of respective light pulses could also allow for controllable power in respective light pulses, thereby offsetting effects of a temperature curve of the light emitter (e.g., laser diode).

Within examples, adjusting a pulse width of an input voltage can allow for an adjusted charge level for a charge storage device. For example, these adjustments can be made in response to a trigger, such as a detected retroreflected object, change in transmission angle and/or direction, or static or dynamic mismatches within the system. By leveraging both the pulse width of an input voltage and the timing of an input pulse, example embodiments allow for precise adjustments to a charge voltage of the charge storage device.

Within further examples, improved pulser circuit efficiency may allow for a lower input voltage level. By lowering the input voltage, the pulser may be operated more frequently, for example, due to lower slew times and less transients. Further, described examples may operate more efficiently in budget-constricted design scenarios by avoiding additional voltage requirements.

II. EXAMPLE SYSTEMS

FIG. 1 is a block diagram of a LIDAR device, according to an example embodiment. In particular, FIG. 1 shows a LIDAR device 100, having a controller 102 configured to control one or more light emitters 110 and one or more corresponding light detectors 112. Within examples, the one or more light emitters can be laser diodes or other light emitting elements. Within examples, the one or more light detectors can include one or more silicon photomultipliers (SiPMs), single-photon avalanche diodes (SPADs), Geiger-mode avalanche photodiodes (G-APDs), other Geiger-mode operated light detectors, or other light detecting elements. The LIDAR device 100 further includes a light emitter driver 114 configured to select and provide power to respective light emitters of the one or more light emitters 110 (e.g., a plurality of laser diodes) and a sampling circuit 116 configured to sample outputs of respective light detectors of the plurality of light detectors 112. The controller 102 includes processor(s) 104, a memory 106, and instructions 108 stored on the memory 106.

Processor(s) 104 can include on or more processors, such as one or more general-purpose microprocessors and/or one or more special purpose microprocessors. The one or more processors may include, for instance, an application-specific integrated circuit (ASIC) or a field-programmable gate array (FPGA). Other types of processors, computers, or devices configured to carry out software instructions are contemplated herein.

Memory 106 may include a computer readable medium, such as a non-transitory computer readable medium, such as, but not limited to, read-only memory (ROM), programmable read-only memory (PROM), erasable programmable read-only memory (EPROM), electrically erasable programmable read-only memory (EEPROM), non-volatile random-access memory (e.g., flash memory), a solid state drive (SSD), a hard disk drive (HDD), a Compact Disc (CD), a Digital Video Disk (DVN), a digital tape, read/write (R/W) CDs, R/W DVNs, etc.

Instructions 108 are stored on memory 120 and executable by the processor(s) 118 to perform functions related to controlling the light emitter driver 114 and the sampling circuit 116, for generating 3D point cloud data, and for processing the 3D point cloud data (or perhaps facilitating processing the 3D point cloud data by another computing device, such as a system controller).

The controller 102 can determine 3D point cloud data by using the light emitters 110 to emit pulses of light. A time of emission is established for each light emitter and a relative location at the time of emission is also tracked. Aspects of an environment of the LIDAR device 100, such as various objects, reflect the pulses of light. For example, when the LIDAR device 100 is in an environment that includes a road, such objects may include vehicles, signs, pedestrians, road surfaces, construction cones, or the like. Some objects may be more reflective than others, such that an intensity of reflected light may indicate a type of object that reflects the light pulses. Further, surfaces of objects may be at different positions relative to the LIDAR device 100, and thus take more or less time to reflect portions of light pulses back to the LIDAR device 100. Accordingly, the controller 102 may track a detection time at which a reflected light pulse is detected by a light detector and a relative position of the light detector at the detection time. By measuring time differences between emission times and detection times, the controller 102 can determine how far the light pulses travel prior to being received, and thus a relative distance of a corresponding object. By tracking relative positions at the emission times and detection times the controller 102 can determine an orientation of the light pulse and reflected light pulse relative to the LIDAR device 100, and thus a relative orientation of the object. By tracking intensities of received light pulses, the controller 102 can determine how reflective the object is. The 3D point cloud data determined based on this information may thus indicate relative positions of detected reflected light pulses (e.g., within a coordinate system, such as a Cartesian coordinate system) and intensities of each reflected light pulse.

As described further below, the light emitter driver 114 is used for selecting light emitters for emitting light pulses, and for providing power to light emitters for emitting light. The sampling circuit 116 is used for sampling outputs from light detectors. Within examples, LIDAR device 100 may include a single light emitter. Accordingly, examples described below may also be applied to a scenario with a single light emitter.

Figure 2:
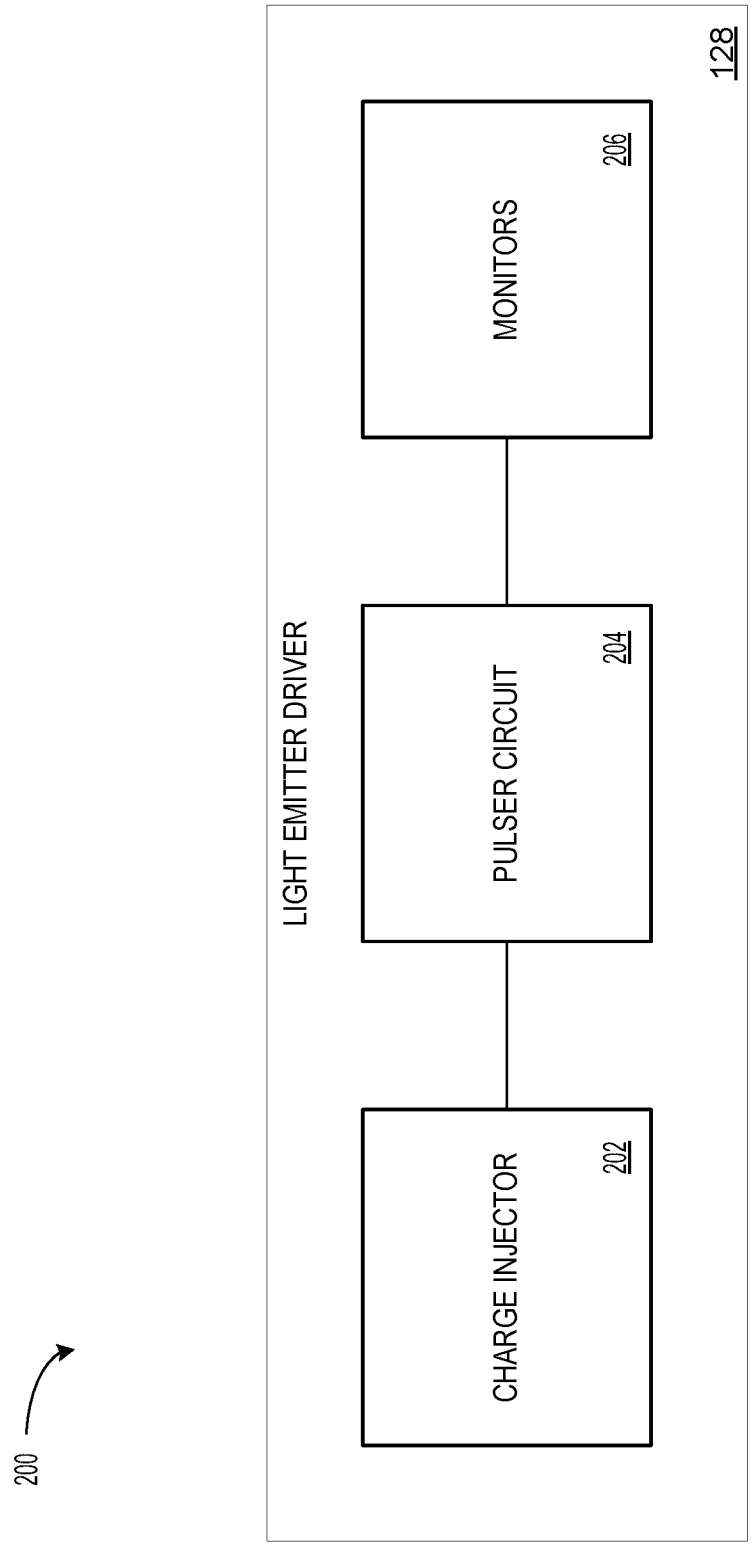
FIG. 2 is a simplified block diagram of a light emitter driver, according to an example embodiment.

FIG. 2 is a simplified block diagram of a light emitter driver 200, according to an example embodiment. Light emitter driver 200 can correspond to light emitter driver 128, and includes a charge injector 202 configured for providing power to one or more charge storage devices (e.g., capacitors, diodes, transistors, or other devices configured to store charge). Light emitter driver 200 further includes a pulser circuit 204 configured to facilitate providing power to one or more charge storage devices and configured to control discharging the one or more charge storage devices to emit pulses of light from one or more corresponding light emitters. Light emitter driver 200 further includes one or more monitors 206 configured to measure aspects of pulser circuit 204.

Charge injector 202 may receive power from a pre-regulator configured to alter a common voltage of a system (e.g. a common voltage from a power bus of LIDAR device 100). For example, a buck converter, boost converter, or buck-boost converter can pre-regulate the common voltage and control a voltage output of charge injector 202. Charge injector may include a switching circuit configured to generate a square wave. For example, charge injector 202 may receive one or more control signals (e.g., from controller 102), and, based on the control signals, generate a square wave having a duty cycle. The square wave can include pulses that rise and fall within a set timeframe (e.g. a pulse width), which can be adjustable based on the control signals. Within examples, a controller can control timing and pulse width of individual pulses from charge injector 202 to effectuate a particular charge voltage for a charge storage device. The output of charge injector 202 can pass through an inductor to drive a current to the pulser circuit 204. Accordingly, charge injector 202, and an associated switching circuit thereof, can generate pulses of an input voltage to an input of the inductor, which in turn provides the input voltage to the pulser circuit 204.

The pulser circuit 204 is configured to receive an output from charge injector 202 and to facilitate charging one or more charge storage devices and discharging the one or more charge storage devices through current paths of one or more light emitters to emit pulses of light. The intensity of light emitted by the light emitters can be a function of the amplitude (e.g. a voltage level) of the square wave, and a pulse width of pulses in the square wave. For example the square wave can be a pulse width modulated (PWM) square wave, and a higher duty cycle may increase the charge of the one or more charge storage devices and thereby increase the intensity of light discharged by the one or more charge storage devices. Further details regarding pulser circuit 204 are provided below with respect to FIGS. 3A, 3B, 3C, and 4.

The one or more monitors 206 can include a temperature monitor configured to determine a temperature of one or more light emitters in pulser circuit 204 and a voltage monitor configured to determine a charge level of one or more charge storage devices in pulser circuit 204. Other types of monitors are possible.

Characteristics of a light emitter may change based on a temperature of the light emitter. For example, a hotter light emitter may emit light at lower frequencies. Because a LIDAR device can be configured to operate within specified wavelengths for efficiency and/or light filtering purposes, it may be beneficial to reduce a temperature of a light detector that has reached a threshold heat level. Accordingly, a controller (e.g., controller 102) can receive an output of the temperature monitor as an input and control how much, or how often, to charge a corresponding charge storage device in order to cool the light emitter. Further, the controller can alter aspects of charge injector 202 and/or pulser circuit 204 to achieve different charge levels of the charge storage device in later charge/discharge cycles of the charge storage device based on the input received from the temperature monitor.

Intensities of a light emitter change depending on how much current passes through the light emitter. As noted above, these light intensities may correspond to a charge level of a corresponding charge storage device, because the charge level corresponds to how much current is received by the light emitter. Accordingly, a voltage monitor for the charge storage device can be used to determine how much light will be emitted by a given light emitter if the charge storage device discharges. The voltage monitor may include a voltage divider and a comparator, and output a signal indicative of the charge level. A controller (e.g., controller 102) can receive an output of the voltage monitor as an input and cause the charge storage device to discharge if the charge storage device has a charge level above a threshold charge level. For example, the controller can cause a switch to connect the charge storage device to ground for a specified period of time, or can control a particular amount of the charge to be applied to emitting light to reach a desired light intensity. Further, the controller can alter aspects of charge injector 202 and/or pulser circuit 204 to achieve different charge levels of the charge storage device in later charge/discharge cycles of the charge storage device based on the input received from the voltage monitor.

Figure 3A:
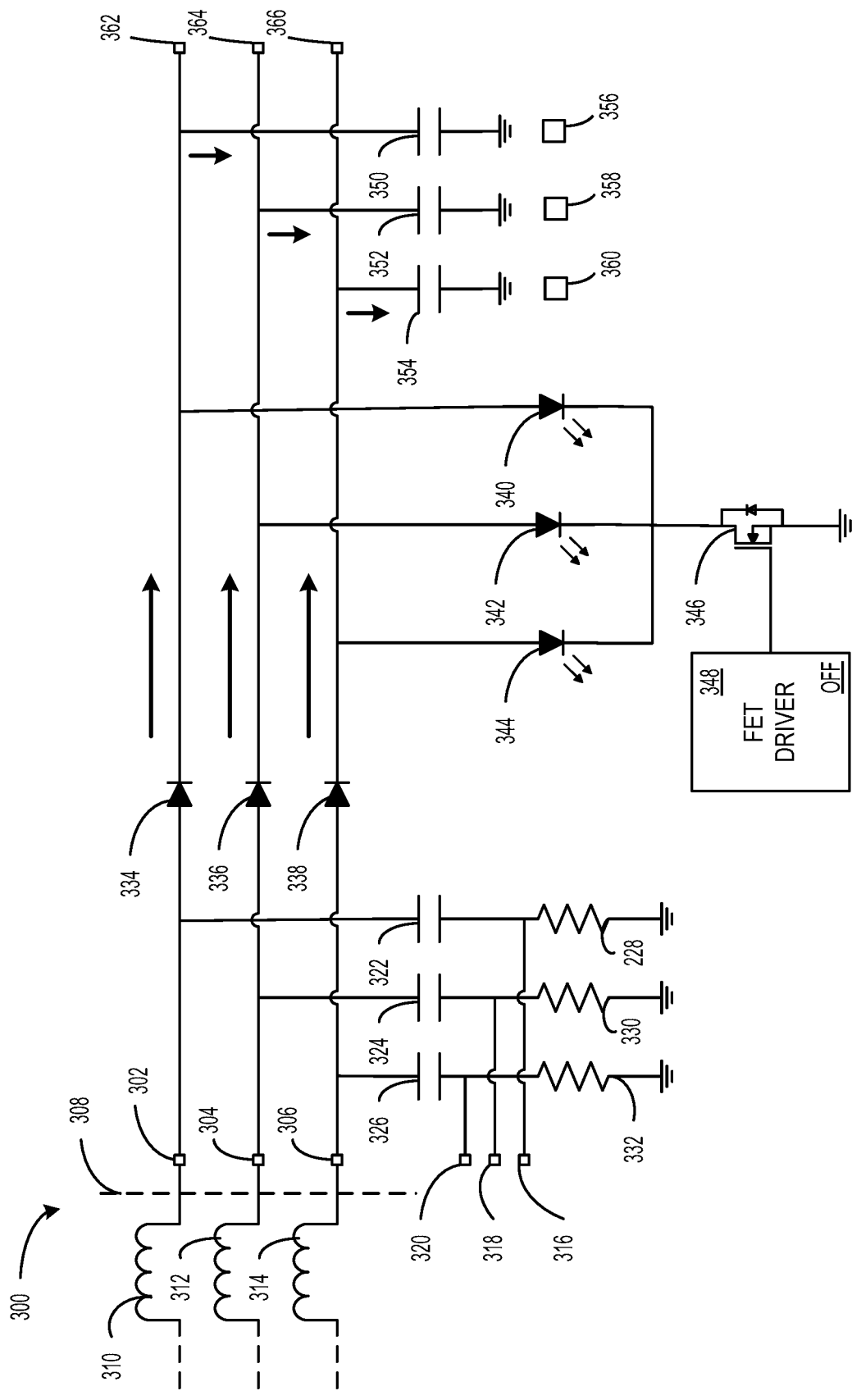
FIG. 3A illustrates a LIDAR pulser circuit at a first time during a charging phase, according to an example embodiment.

FIG. 3A illustrates a LIDAR pulser circuit 300 at a first time during a charging phase, according to an example embodiment. LIDAR pulser circuit 300 can correspond to pulser circuit 204 described above with respect to FIG. 2. LIDAR pulser circuit 300 (otherwise referred to herein as "pulser circuit 300") is depicted as including a plurality of current paths that correspond to a plurality of charge storage devices and light emitters. In particular, pulser circuit 300 includes circuit nodes 302, 304, and 306, each corresponding to a different current path. Circuit nodes 302, 304, and 306 respectively receive current via an interface 308 between pulser circuit 300 and a charge injector (e.g., charge injector 202). To illustrate this, FIG. 3A shows inductors 310, 312, and 314, which respectively correspond to circuit nodes 302, 304, and 306. Inductors 310, 312, and 314 may each receive a separate square wave and drive a current through a respective current path.

Pulse circuit 300 also includes a plurality of snubber circuits, each of which corresponds to a different current path. In particular, a first snubber circuit includes a node 316, charge storage device 322, and resistor 328, and is connected to a first current path associated with circuit node 302. A second snubber circuit includes a node 318, charge storage device 324, and resistor 330, and is connected to a second current path associated with circuit node 304. A third snubber circuit includes a node 320, charge storage device 324, and resistor 332, and is connected to a third current path associated with circuit node 306.

Pulser circuit 300 also includes diodes 334, 336, and 338, which respectively correspond to the first, second, and third current paths. The first snubber circuit, second snubber circuit, and third snubber circuit are respectively connected between circuit nodes 302, 304, and 306, and diodes 334, 336, and 338. Circuit nodes 302, 304, and 306, and the snubber circuits are connected to anodes of diodes 334, 336, and 338, which are oriented to allow current to flow from circuit nodes 302, 304, and 306 to the charge storage devices and light emitters in pulser circuit 300. The snubber circuits are configured to reduce switching responses at rising and falling edges of input pulses in the current paths.

Pulser circuit 300 further includes light emitters 340, 342, and 344, which respectively correspond to diodes 334, 336, and 338. Light emitters 340, 342, and 344 can be laser diodes or another type of light emitting element. Light emitters 340, 342, and 344 are configured to emit light responsive to receiving a current, and may operate similarly to a diode, as shown in FIG. 3A.

Pulser circuit 300 further includes a switch 346 (e.g., switch 346 can be a gallium nitride field-effect transistor as depicted in FIG. 3A, a limit switch, or another type of switching device). Switch 346 is configured to allow or restrict current flow based on a control signal received from FET driver 348. Though FET driver 348 is depicted as corresponding to a FET transistor, it should be understood that a different switching driver could be used to drive other types of switches. As shown in FIG. 3A, when switch 346 is "off" (i.e., not permitting current to flow), a current might also not flow through light emitters 340, 342, and 344. Accordingly, when switch 346 is off, light emitters 340, 342, and 344 may not emit light. By contrast, when switch 346 is "on" (i.e., allowing current to flow) current can flow through emitter 340, 342, and 344 to ground, causing them to emit light, as depicted in FIG. 3C. The intensity of light depends on a level of current flow through each respective light emitter, which in turn corresponds to a charge level in a current path of each respective light emitter.

Pulser circuit 300 further includes charge storage devices 350, 352, and 354 (which are depicted as capacitors for illustrative purposes). A first terminal of each charge storage device is connected to a respective circuit node via a diode, and a second terminal of each charge storage device is connected to ground. charge storage devices 350, 352, and 354 are each configured to charge based on an input received from circuit nodes 302, 304, and 306. As shown in FIG. 3A, for a given charge storage device, an inductor, circuit node, diode, and charge storage device may form a "voltage doubler" circuit, which effectively doubles the input voltage (Vn) received from a given circuit node. Once charged, each charge storage device can be discharged responsive to switch 346 being in an on state, thereby allowing current to flow through light emitters 340, 342, and 344.

In some circuits, such as the described voltage doubler circuit, some energy can be transferred to a parasitic inductance while discharging the charge storage devices. In FIG. 3C, this parasitic inductance is represented by parasitic inductors 368, 370, and 372, which respectively correspond to discharging capacitors 350, 352, and 354. As the capacitors discharge to ground, the parasitic inductance can build in parasitic inductors 368, 370, and 372, and can eventually drive a charge voltage across capacitors 350, 352, and 354 below zero. This energy is typically wasted due to heat loss. However, within examples, this parasitic inductance can be used in subsequent charging cycles to charge storage devices 350, 352, and 354. This characteristic can be leveraged by the controller to increase the efficiency in driving emitted light from light emitters 340, 342, and 344. Further details regarding this utilization of parasitic inductance are described below with respect to FIG. 4.

For illustrative purposes, FIG. 3A shows charge level indicators 356, 358, and 360 that respective correspond to charge storage devices 350, 352, and 354. This can indicate that a charge voltage associated with each charge storage device is about zero. As noted above, FIG. 3A illustrates a status of the pulser circuit 300 at a first time. At the first time, FET driver 348 has not sent a control signal for firing light emitters 340, 342, and 344. Accordingly, switch 346 is an off state, and current flows instead to the first terminal of charge storage devices 350, 352, and 354, thereby charging the charge storage devices. At the first time illustrated in FIG. 3A, the charge storage devices are indicated as empty in charge indicators 356, 358, and 360, because they have just begun to charge.

Pulser circuit 300 further includes charge nodes 362, 364, and 366 that respectively indicate a charge level of charge storage devices 350, 352, and 354 at a given time. A voltage readout from each charge node can be monitored to determine the charge level of the charge storage devices. For example, a voltage divider and a comparator circuit can be connected to each charge node to determine the charge level at a given time. In this manner, a controller can determine when to send a control signal to FET driver 348 that causes each charge storage device to discharge by comparing the readout charge level to a threshold charge level set by the controller.

Figure 3B:
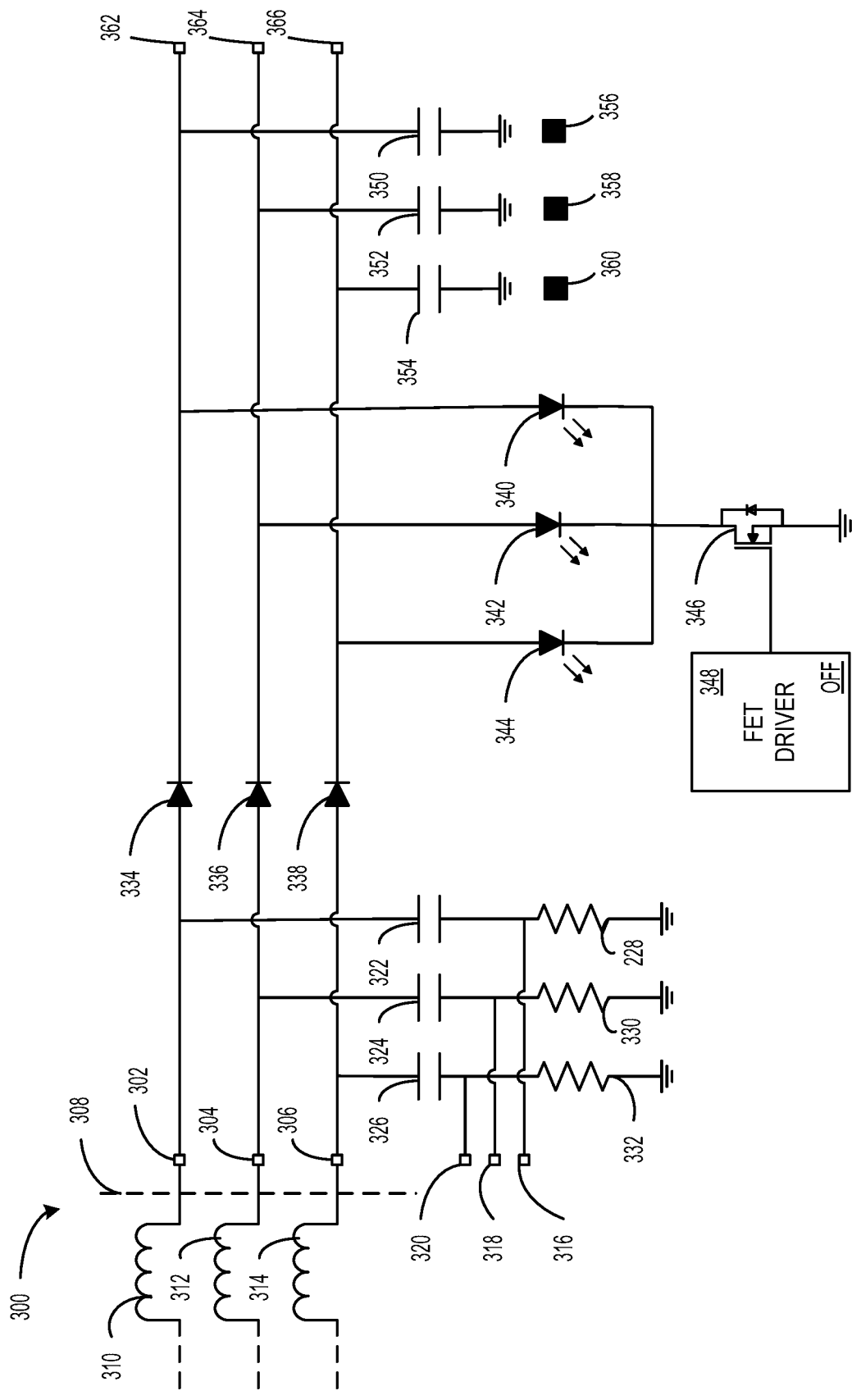
FIG. 3B illustrates a LIDAR pulser circuit at a second time during an idle phase, according to an example embodiment.
Figure 3C:
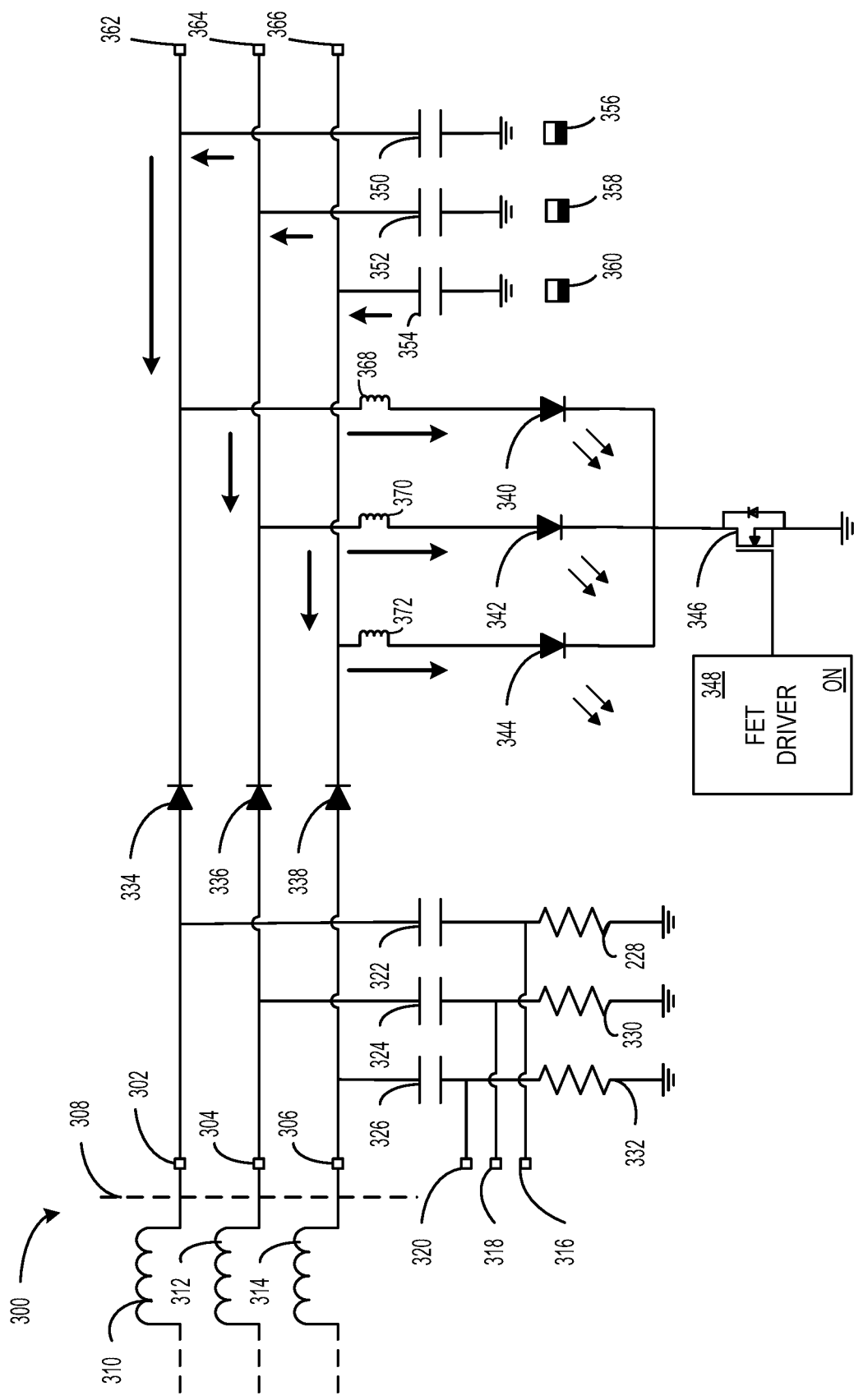
FIG. 3C illustrates a LIDAR pulser circuit at a third time during an emitting phase, according to an example embodiment.

FIG. 3B illustrates the LIDAR pulser circuit 300 at a second time, according to an example embodiment. At the second time, charge storage devices 350, 352, and 354 have each been charged to a charge level associated with a predetermined intensity of light for light emitters 340, 342, and 344. Thus, at the second time, a charge voltage associated with charge storage devices 350, 352, and 354 can be at a peak charge voltage for light emission purposes. This is illustrated in FIG. 3B with charge indicators 356, 358, and 360. Further, FET driver 348 indicates that switch 346 is in an off state. Accordingly, at the second time, charge storage devices 356, 358, and 360 are charged, but have not yet discharged, so light emitters 340, 342, and 344 are not emitting light.

FIG. 3C illustrates the LIDAR pulser circuit 300 at a third time, according to an example embodiment. At the third time, charge storage devices 350, 352, and 354 are in the process of discharging. Thus, at the third time, at least a portion of a charge voltage associated with charge storage devices 350, 352, and 354 is applied to light emitters 340, 342, and 344. This is illustrated in FIG. 3C with charge indicators 356, 358, and 360, and with indicator lines that show a direction of current flow from charge storage devices 350, 352, and 354 to light emitters 340, 342, and 344. Discharging charge storage devices 350, 352, and 354 is responsive to FET driver 348 providing a trigger signal (Tx) that causes switch 346 to operate in an on state. At the third time the charge storage devices discharge through light emitters 340, 342, and 344 to ground. Accordingly, light emitters 340, 342, and 344 are emitting light at the third time.

While the charge storage devices discharge, a portion of the charge voltage is applied to the light emitters and a portion is applied to a parasitic inductance. Without parasitic inductance, the charge voltage may drop to a non-zero voltage associated with a light emission threshold of a light detector. However, with the introduction of parasitic inductance, the charge voltage may drop below the light emission threshold, or even below 0V. This characteristic of pulser circuit 300 and corresponding operations of a controller are described further below with respect to FIG. 4.

Figure 4:
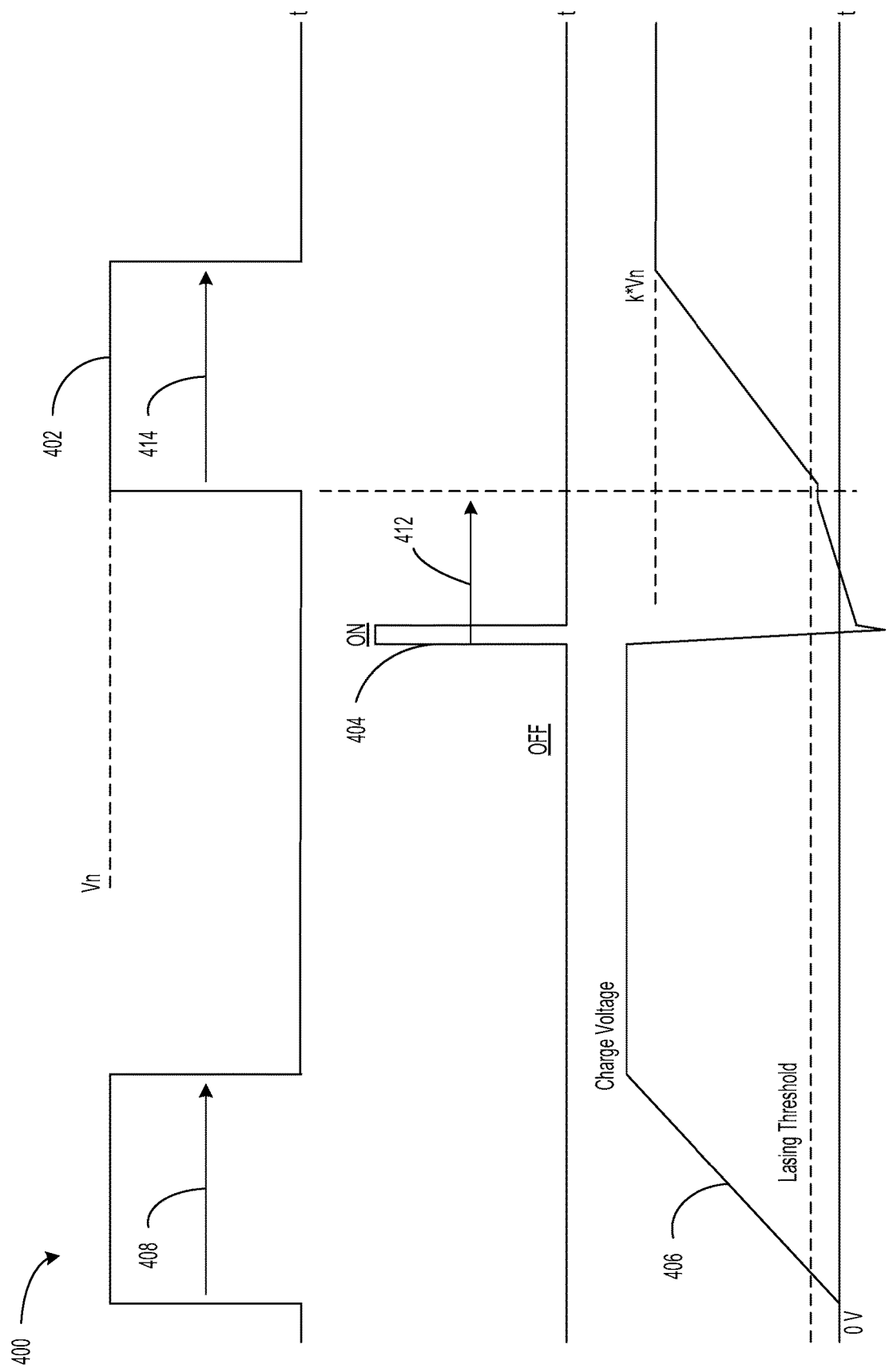
FIG. 4 illustrates a timing diagram of a LIDAR pulser circuit, according to an example embodiment.

FIG. 4 illustrates a timing diagram 400 of a LIDAR pulser circuit, according to an example embodiment. In particular, FIG. 4 shows a timing of input voltage (Vn) 402 (e.g., a voltage provided by circuit node 302), a timing of a trigger signal (Tx) 404 (e.g., a trigger signal from FET driver 348), and a charge voltage 406 of a charge storage device (e.g., charge storage device 350). FIG. 4 depicts a scenario in which the charge storage device is initially charged to a first charge voltage, is discharged responsive to a trigger signal 404, then recharged with a pulse of an input voltage 406. As shown in FIG. 4, a charge storage device will continue charging while exposed to input voltage 402. Accordingly, as a pulse width 408 of input voltage 402 increases, so too can the charge voltage 406 associated with a charged charge storage device. Thus, if a higher charge voltage is desired, a controller can increase the pulse width 408 of the input voltage 402 until reaching the time constant of the pulser circuit 300 (e.g., the time constant of inductor 310 and charge storage device 350).

As shown in FIG. 4, at the rising edge of the trigger signal 404, the charge storage device begins discharging and charge voltage 406 correspondingly decreases. With an ideal charge storage device, charge voltage 406 would not necessarily drop beyond the light emission threshold of a light emitter (labelled "lasing threshold" in FIG. 4). However, due to parasitic inductance associated with discharging the charge storage device, charge voltage 406 drops below the lasing threshold, and even below 0V.

A time difference 412 between a rising edge of trigger signal 404 and a rising edge of input voltage 402 also corresponds to the resulting charge voltage. Because pulser circuit 300 is a doubler circuit, and because the voltage circuit operates on a voltage difference (e.g., a difference between Vn and the charge voltage at a given time), the charge storage device can charge based on a negative voltage resulting from parasitic inductance. In particular, the resulting charge voltage can be more than 2*Vn depending on the charge voltage at the leading edge of the pulse of the input signal, the pulse width 408, and the time constant of the charge storage device. For example, if the charge voltage is still negative at the leading edge of the pulse of the input voltage 402, then the resulting voltage could be more than 2*Vn. Any of these factors could be changed in order to arrive at a desired charge voltage or to account for characteristics of pulser circuit 300. For example, reducing charge voltage 406 may allow for a light emitter to cool off for a charging cycle in order to maintain an appropriate light frequency.

In FIG. 4, charge voltage 406 is depicted as having a reduced voltage level (k*Vn). This may result from a reduced charging pulse width, or an increased time difference 412 between a rising edge of trigger signal 404 and a rising edge of input voltage 402 relative to a previous charging cycle of the charge storage device. As depicted in FIG. 4, a second pulse width 414 is the same as first pulse width 408, so the lowered charge voltage (k*Vn) results from time difference 412. Accordingly, k can be a mutiplier derived from one or more of these factors. For example, based on a desired light intensity from a light emitter and a known parasitic inductance associated with the charge storage device, a controller can alter timing of the trigger signal 404 and the pulse of the input voltage 402. Within examples, determining the parasitic inductance can be based on a difference between the charge voltage 406 immediately after discharging the charge storage device and the light emission threshold of a light emitter. Accordingly, in this manner, a transmit power of the laser power circuit is tunable based on input voltage pulse width, trigger signal timing and/or pulse timing, or a combination thereof. As noted above, changing charge voltage 406 can be based on other factors as well, such as a temperature of light emitter.

Figure 5:
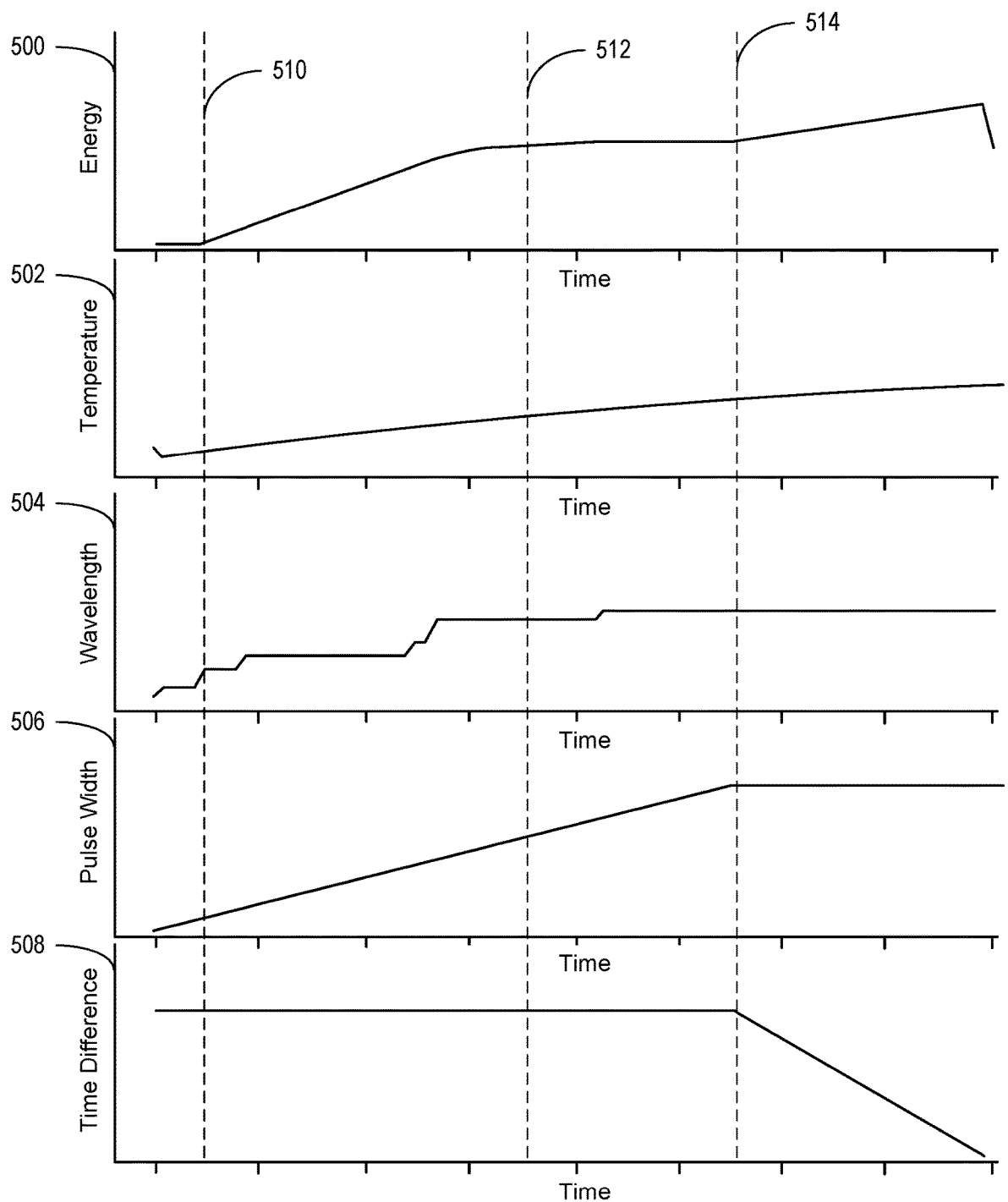
FIG. 5 illustrates changes in properties of a light pulse circuit over time.

FIG. 5 illustrates changes to properties of a pulser circuit over time. These changes are indicative of operational behavior of example pulser circuits described herein. In particular, FIG. 5 shows an energy graph 500, a temperature graph 502, a wavelength graph 504, a pulse width graph 506, and a time difference graph 508. Energy graph 500 shows an energy level light of successive light pulses emitted over a period of time. Temperature graph 502 shows a temperature level of a light emitter (e.g., a laser diode) used for emitting each of the successive light pulses over the period of time. Wavelength 504 shows a wavelength of the successive light pulses over the period of time. Pulse width graph 506 shows changes to pulse widths for the successive light pulses over the period of time. Time difference graph 508 shows time differences between a rising edge of a trigger signal and a rising edge of an input voltage for each of the successive light pulses over the period of time.

FIG. 5 further illustrates a plurality of benchmark times on the graphs. Prior to a first time 510, energy graph 500 shows that no energy is being output by light pulses because the pulse width is insufficient to generate a voltage across the charge storage device that exceeds an emission threshold of the light emitter (e.g., a lasing threshold of a laser diode). Between first time 510 and a second time 512, energy graph 500 shows that the energy level of successive light pulses increases and pulse width graph 506 shows that pulse width of the light pulses increases between an mission threshold of the light emitter up to an LC time constant of the pulser circuit). Between second time 512 and a third time 514, energy graph 500 shows that the energy level of successive pulses remains relatively constant and pulse width graph 506 shows that pulse width of the light pulses increases (e.g., past LC time constant of the pulser circuit). The energy level does not increase because the pulse width exceeds the LC time constant of the pulser circuit. After third time 514, energy graph 500 shows that the energy level increases, pulse width graph 506 shows that pulse width of the light pulses remains constant, and the time difference graph 508 shows that the time difference decreases, illustrating that, as a delay between rising edge of the trigger signal and a rising edge of the input voltage decreases extra energy gained by using the parasitic inductance from the pulser circuit.

III. EXAMPLE METHODS

Described herein are example methods and processes that could be implemented in LIDAR device 100, light emitter drive 128, or pulser circuit 300. However, the described methods and processes described could be implemented in other systems or devices, or in LIDAR devices that are configured differently than LIDAR device 100.

Figure 6:
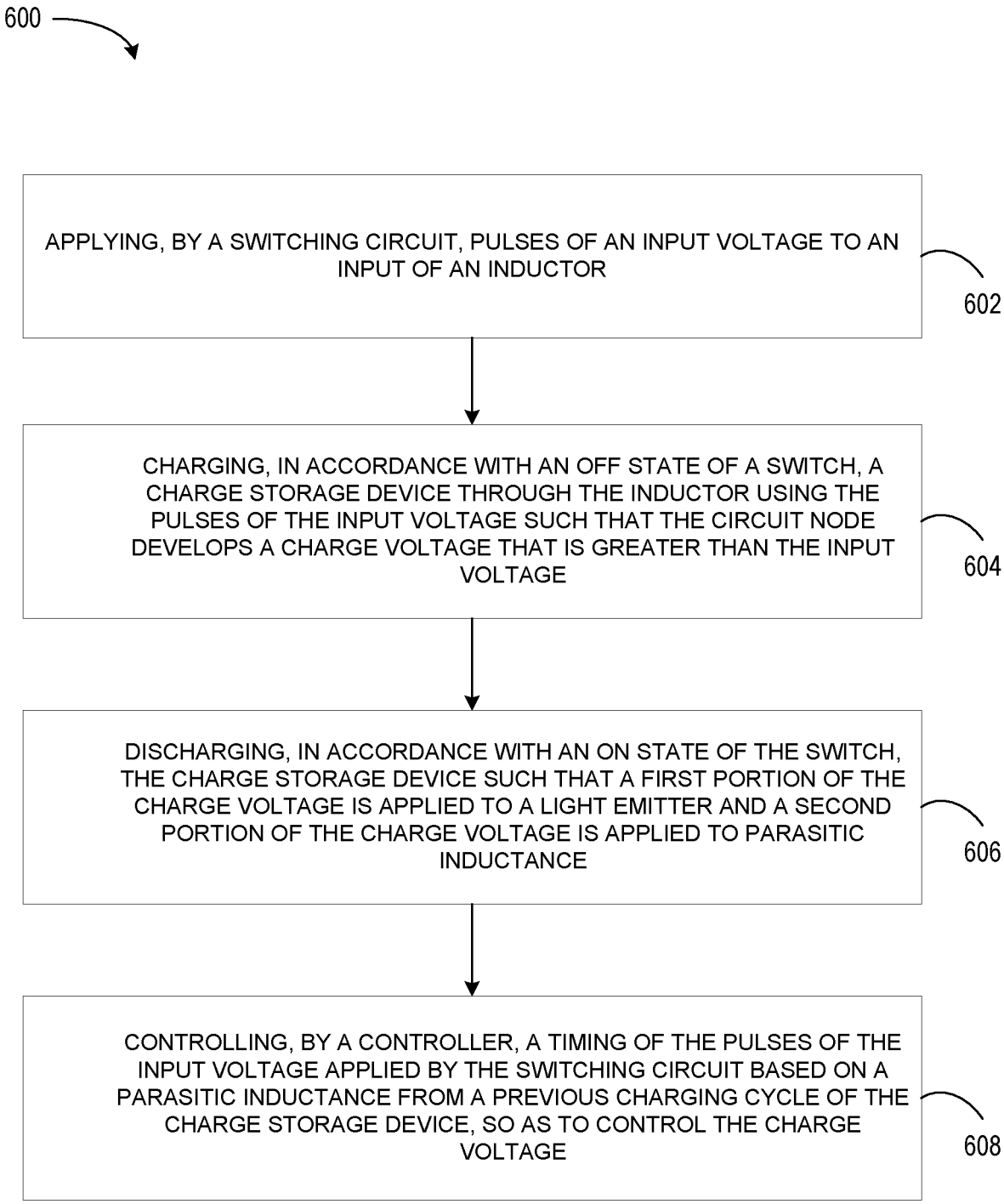
FIG. 6 is a flowchart of a method, according to an example embodiment.

FIG. 6 is a flowchart of a method 600, according to an example embodiment. Method 600 presents an embodiment of a method that could be used with any of LIDAR device, light emitter drive 128, or pulser circuit 300, for example, or with other systems or devices. Method 600 may include one or more operations, functions, or actions as illustrated by one or more of blocks 602-608.

In addition, for method 600 and other processes and methods disclosed herein, the flowchart shows functionality and operation of one possible implementation of present embodiments. In this regard, each block may represent a module, a segment, a portion of a manufacturing or operation process, or a portion of program code, which includes one or more instructions executable by a processor for implementing specific logical functions or steps in the process. The program code may be stored on any type of computer readable medium, for example, such as a storage device including a disk or hard drive. The computer readable medium may include a non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device.

In addition, for method 600 and other processes and methods disclosed herein, each block in FIG. 6 may represent circuitry that is wired to perform the specific logical functions in the process.

At block 602, method 600 includes applying, by a switching circuit, pulses of an input voltage to an input of an inductor. For example, this may include a switching circuit of charge injector 202 generating a square wave, or one or more individually controlled input voltage pulses.

At block 604, method 600 includes charging, in accordance with an off state of a switch, a charge storage device through the inductor using the pulses of the input voltage such that the circuit node develops a charge voltage that is greater than the input voltage. For example, a transistor (e.g., switch 346) may prevent current flow through one or more light emitters to ground, and allow a capacitor (e.g., charge storage device 350) to store charge. In alternative examples, method 500 may include charging, in accordance with an off state of the switch, the charge storage device through the inductor using the pulses of the input voltage such that the circuit node develops a charge voltage that is lower than the input voltage. For example, as described above with respect to FIG. 4, an increased time difference between a rising edge of trigger signal and a rising edge of input voltage relative to a previous charging cycle of the charge storage devices may result in a charge voltage that is lower than the input voltage. Further, while a voltage doubler is described above that increases a voltage output relative to a voltage input, other circuits that do not increase voltage are contemplated herein. For example, blocks 506 and 508 described below may be performed using another type of pulser circuit.

At block 606, method 600 includes discharging, in accordance with an on state of the switch, the charge storage device such that a first portion of the charge voltage is applied to a light emitter and a second portion of the charge voltage is applied to parasitic inductance. For example this may involve a portion of a charge voltage of the charge storage device to flow through a light emitter, causing the light emitter to emit light, and another portion of the charge voltage to be stored within a circuit (e.g., pulser circuit 300) in the form of parasitic inductance (e.g., as depicted in FIG. 3C as parasitic inductor 368).

At block 608, method 600 includes controlling, by a controller, a timing of the pulses of the input voltage applied by the switching circuit based on a parasitic inductance from a previous charging cycle of the charge storage device, so as to control the charge voltage. For example, for at least one pulse of the pulses, a previous discharge cycle of a charge storage device may have caused a measurable reduction in voltage at the charge storage device (e.g., a negative voltage). For example, this can be measured with a voltage monitor of monitors 306. The controller can control the timing of a subsequent pulse of the input voltage based on the desired charge voltage and the charge voltage resulting from parasitic inductance. As described with respect to FIG. 4, increasing the time difference between a rising edge of a trigger signal for the switch and a rising edge of a pulse of an input voltage can effectively decrease the charge voltage in a charging cycle. Conversely, reducing the time difference may increase the charge voltage. In related examples, the controller can alter the timing of a trigger signal from the FET driver 428 (or another type of driver for a switch) in order to adjust the charge voltage.

Within examples, method 600 further includes monitoring a temperature for the light emitter using a temperature monitor (e.g., a temperature monitor of monitors 206 described above with respect to FIG. 2), and regulating the temperature of the light emitter based on an output of the temperature monitor. For example, regulating the temperature of the light emitter may involve reducing a charge voltage in a subsequent pulse to the light emitter or waiting for period prior to emitting a subsequent light pulse. Further, as described above, the temperature may affect power output from the light emitter, and the temperature can be used for determining changes to a pulse width or time difference to refine a power level of one or more light pulses. In further examples, the temperature may correspond to wavelengths emitted from the light emitter, as shown in FIG. 5. These relationships between temperature and wavelength can be maintained in a lookup table the light emitter. In these examples, the temperature can be regulated to control wavelengths of the emitted light. For example, the wavelength can be maintained within a threshold range of wavelengths by using the temperature to control how often light pulses are emitted, or the power level of emitted light pulses.

Within examples, method 600 can further include monitoring a voltage across the charge storage device using a voltage monitor (e.g., a voltage monitor of monitors 206 described above with respect to FIG. 2), and regulating the voltage across the charge storage device based on an output of the voltage monitor. For example, this may involve partially discharging the capacitor or providing an additional pulse of input voltage to increase the charge level.

Within examples, discharging the charge storage device such that the first portion of the charge voltage is applied to the light emitter and the second portion of the charge voltage is applied to parasitic inductance results in a negative voltage across the charge storage device. For example, this may occur as depicted in FIG. 4.

Within examples, method 600 further includes determining energy applied to parasitic inductance prior to charging the charge storage device using pulses of the input voltage, and determining a pulse width for the pulses of the input voltage based on the energy applied to parasitic inductance prior to charging the charge storage device. For example, determining the energy applied to parasitic inductance may involve determining a lowest charge voltage following the charge storage device discharging, and comparing the lowest charge voltage to a light emission threshold. The pulse width increasing may correspondingly increase a charge voltage in a subsequent charge of the charge storage device. Decreasing the pulse width may correspondingly decrease the charge voltage in the subsequent charge of the charge storage device. Accordingly, the controller may increase or decrease the pulse width to achieve a given charge level.

Though examples are described herein of adjusting a charge voltage either by changing timing of a pulse of an input voltage, changing timing of a trigger signal for a switch, or changing a pulse width of a pulse of an input voltage, any of these features can be implemented concurrently. For example, a controller may determine a desired multiplier for the input voltage of a pulse and account for transfer functions of one or more timing changes or pulse adjustments to arrive at the desired multiplier.

IV. CONCLUSION

The particular arrangements shown in the Figures should not be viewed as limiting. It should be understood that other implementations may include more or less of each element shown in a given Figure. Further, some of the illustrated elements may be combined or omitted. Yet further, an exemplary implementation may include elements that are not illustrated in the Figures. Additionally, while various aspects and implementations have been disclosed herein, other aspects and implementations will be apparent to those skilled in the art. The various aspects and implementations disclosed herein are for purposes of illustration and are not intended to be limiting, with the true scope and spirit being indicated by the following claims. Other implementations may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations.

What is claimed is:

1. A method comprising:
    applying, by a switching circuit, pulses of an input voltage to an input of an inductor;
    charging, in accordance with an off state of a switch, a charge storage device through the inductor using the pulses of the input voltage such that a circuit node develops a charge voltage that is greater than the input voltage;
    discharging, in accordance with an on state of the switch, the charge storage device such that a first portion of the charge voltage is applied to a light emitter and a second portion of the charge voltage is applied to parasitic inductance; and
    controlling, by a controller, a timing of the pulses of the input voltage applied by the switching circuit based on a parasitic inductance from a previous charging cycle of the charge storage device, so as to control the charge voltage.

2. The method of claim 1, further comprising:
    monitoring a temperature for the light emitter using a temperature monitor; and
    regulating the temperature of the light emitter based on an output of the temperature monitor.

3. The method of claim 1, further comprising:
    monitoring a voltage across the charge storage device using a voltage monitor; and
    regulating the voltage across the charge storage device based on an output of the voltage monitor.

4. The method of claim 1, wherein discharging the charge storage device such that the first portion of the charge voltage is applied to the light emitter and the second portion of the charge voltage is applied to parasitic inductance results in a negative voltage at a first terminal of the charge storage device.

5. The method of claim 1, further comprising:
    determining energy applied to parasitic inductance prior to charging the charge storage device using the pulses of the input voltage; and
    determining a pulse width for the pulses of the input voltage based on the energy applied to parasitic inductance prior to charging the charge storage device.

6. A system, comprising:
    an inductor having an input and an output;
    a circuit node;
    a diode connected between the output of the inductor and the circuit node;
    a charge storage device connected to the circuit node;
    a switch;
    a light emitter connected between the circuit node and the switch;

a switching circuit configured to apply pulses of an input voltage to the input of the inductor, wherein, when the switch is in an off state, the pulses of the input voltage charge the charge storage device through the inductor and diode such that the circuit node develops a charge voltage that is greater than the input voltage;

wherein, when the switch is in an on state, the charge storage device discharges such that a first portion of the charge voltage is applied to the light emitter and a second portion of the charge voltage is applied to parasitic inductance; and a controller configured to control a timing of the pulses of the input voltage applied by the switching circuit based on a parasitic inductance from a previous charging cycle of the charge storage device, so as to control the charge voltage.

7. The system of claim 6, wherein the first portion of the charge voltage applied to the light emitter causes the light emitter to emit a pulse of light.

8. The system of claim 6, wherein the charge voltage corresponds to a pulse width of the pulses of the input voltage.

9. The system of claim 6, wherein charge voltage is approximately twice the input voltage.

10. The system of claim 6, wherein discharging the charge storage device such that the first portion of the charge voltage is applied to the light emitter and the second portion of the charge voltage is applied to parasitic inductance results in a negative voltage at a first terminal of the charge storage device.

11. The system of claim 6, wherein the charge voltage corresponds to energy applied to parasitic inductance prior to charging the charge storage device using the pulses of the input voltage.

12. The system of claim 6, wherein the charge storage device includes a first terminal that is connected to the circuit node and a second terminal that is connected to ground.

13. The system of claim 6, wherein the switch is a Gallium Nitride field-effect switch that has a gate, a source, and a drain.

14. The system of claim 13, wherein the drain is connected to the light emitter and the source is connected to ground.

15. The system of claim 6, further comprising a pre-regulator configured to alter a voltage from a common voltage to an input voltage for the switching circuit.

16. The system of claim 6, wherein the controller is further configured to control a pulse width of the pulses of the input voltage applied by the switching circuit based on the parasitic inductance from the previous charging cycle of the charge storage device, so as to control the charge voltage.

17. The system of claim 6, further comprising a temperature monitor for the light emitter, wherein the switching circuit is configured to regulate a temperature of the light emitter based on an output of the temperature monitor.

18. The system of claim 6, further comprising a voltage monitor configured to measure a voltage across the charge storage device and to regulate the voltage across the charge storage device based on an output of the voltage monitor.

19. A light detection and ranging (LIDAR) device, comprising:

an inductor having an input and an output;

a circuit node;

a diode connected between the output of the inductor and the circuit node;

a charge storage device connected to the circuit node;

a switch;

a light emitter connected between the circuit node and the switch;

a switching circuit configured to apply pulses of an input voltage to the input of the inductor, wherein, when the switch is in an off state, the pulses of the input voltage charge the charge storage device through the inductor and diode such that the circuit node develops a charge voltage that is greater than the input voltage;

wherein, when the switch is in an on state, the charge storage device discharges such that a first portion of the charge voltage is applied to the light emitter and a second portion of the charge voltage is applied to parasitic inductance; and a controller configured to control a timing of the pulses of the input voltage applied by the switching circuit and a timing of the on and off states of the switch so as to control how much of the charge voltage is applied to the light emitter.

20. The LIDAR device of claim 19, wherein the controller is further configured to control a pulse width of the pulses of the input voltage applied by the switching circuit based on the parasitic inductance from a previous charging cycle of the charge storage device, so as to control the charge voltage.

* * * * *